(12) United States Patent
Li et al.

(10) Patent No.: US 11,217,632 B2
(45) Date of Patent: Jan. 4, 2022

(54) DISPLAY PANEL AND A DISPLAY DEVICE

(71) Applicant: BOE Technology Group Co., Ltd., Beijing (CN)

(72) Inventors: Zhenzhen Li, Beijing (CN); Libin Liu, Beijing (CN); Hui Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/518,020

(22) Filed: Jul. 22, 2019

(65) Prior Publication Data
US 2020/0127062 A1    Apr. 23, 2020

(30) Foreign Application Priority Data

Oct. 19, 2018 (CN) .......................... 201821701468.3

(51) Int. Cl.
*H01L 27/32* (2006.01)

(52) U.S. Cl.
CPC .... *H01L 27/3218* (2013.01); *H01L 2227/323* (2013.01)

(58) Field of Classification Search
None
See application file for complete search history.

(56) References Cited

U.S. PATENT DOCUMENTS

| | | | | |
|---|---|---|---|---|
| 10,522,101 | B2* | 12/2019 | Fang | G09G 3/3611 |
| 10,522,587 | B2* | 12/2019 | Zeng | H01L 27/1214 |
| 2018/0136513 | A1* | 5/2018 | Liu | G02F 1/133514 |
| 2018/0337217 | A1* | 11/2018 | Zang | H01L 51/5281 |
| 2019/0088709 | A1* | 3/2019 | Zeng | H01L 27/326 |
| 2019/0164510 | A1* | 5/2019 | Fang | G09G 3/3611 |

FOREIGN PATENT DOCUMENTS

| | | | | |
|---|---|---|---|---|
| CN | 107481623 | A | * | 12/2017 |
| CN | 108447395 | A | * | 8/2018 ........... H01L 27/326 |

OTHER PUBLICATIONS

ISR Search report for PCT/CN2019/111011 (Year: 2019).*

* cited by examiner

*Primary Examiner* — Telly D Green
(74) *Attorney, Agent, or Firm* — Westman, Champlin & Koehler, P.A.

(57) ABSTRACT

An display panel and a display device are provided, the display panel having a display region defined therein, the display region including: a regular display region; and an irregular display region located at corners of the regular display region, the irregular display region comprising a first region and a second region which is located at edges of the irregular display region and outside the first region; the first region is provided with a plurality of first pixels therein, and the second region is provided with a plurality of second pixels therein, each of the plurality of second pixels having an area smaller than that of each of the plurality of first pixels.

11 Claims, 3 Drawing Sheets

DISPLAY PANEL AND A DISPLAY DEVICE

CROSS-REFERENCE TO RELATED APPLICATION

The present disclosure claims the benefit of Chinese Patent Application Invention No. 201821701468.3 filed on Oct. 19, 2018 in the State Intellectual Property Office of China, the whole disclosure of which is incorporated herein by reference.

BACKGROUND

Field

Embodiments of the present disclosure generally relate to the technical field of display technology, and in particular, to a display panel and a display device.

Description of the Related Art

On display screens of terminals such as mobile-phones, pads, or computers, it is required to design round corners at four corner portions of each display screen; and especially for a display screen which for example adopts an AMOLED display panel and is expected to have corner portions each in the form of a round-corner design, in a condition that pixels each of which further adopts sub-pixel algorithm are used during the design, since even an area of a minimal repetitive unit among pixels or among sub-pixels may be relatively large, then, an entire pixel unit or even an entire sub-pixel unit may not be provided completely/entirely at a boundary or border of the corner portions each in the form of a round-corner design, resulting in that an issue of a visual feeling of some saw-tooth forms appearing at the boundary/border of the corner portions each in the form of a round-corner of a display screen (e.g., an AMOLED display panel) may be observed by an observer.

SUMMARY

The embodiments of the present disclosure have been made to overcome or alleviate at least one aspect of the above mentioned disadvantages and/or shortcomings in the prior art, by providing a display panel and a display device, so as to solve a problem that an issue of a visual feeling of some saw-tooth forms appearing at edge regions of an irregular display panel.

Following technical solutions are adopted in exemplary embodiments of the disclosure.

According to one aspect of embodiments of the disclosure, there is provided a display panel, the display panel having a display region defined therein, the display region comprising: a regular display region; and an irregular display region located at corners of the regular display region, the irregular display region comprising a first region and a second region which is located at edges of the irregular display region and outside the first region; the first region is provided with a plurality of first pixels therein, and the second region is provided with a plurality of second pixels therein, each of the plurality of second pixels having an area smaller than that of each of the plurality of first pixels.

According to an exemplary embodiment of the present disclosure, the second region comprises a first sub-region and a second sub-region and the plurality of second pixels comprises a plurality of first sub-pixels provided within the first sub-region and a plurality of second sub-pixels provided within the second sub-region; in response to the first region being a continuous region in a stepped form, a plurality of outer side edges of the first region facing away from the regular display region are a plurality of side edges which are sequentially in a staggered arrangement and are formed into a series of right-angle stepped shapes sequentially connected with one another, and a plurality of inner side edges of the second region facing towards the regular display region are a plurality of side edges which are sequentially in a staggered arrangement and are formed into a series of right-angle stepped shapes sequentially connected with one another, the plurality of outer side edges of the first region abutting against the plurality of inner side edges of the second region respectively; and in response to the first region being a continuous region in a rectangular form, outer side edges of the first region facing away from the regular display region are two right-angle side edges orthogonal to each other, and inner side edges of the second region facing towards the regular display region are two right-angle side edges orthogonal to each other, the outer side edge of the first region abutting against the inner side edge of the second region respectively.

According to an exemplary embodiment of the present disclosure, a dimension of each of side edges of each of the plurality of first sub-pixels in a width direction of each of the plurality of first pixels is the same as a width of each of the plurality of first pixels, and a dimension of each of side edges of each of the plurality of first sub-pixels in a length direction of each of the plurality of first pixels is smaller than a length of each of the plurality of first pixels; and a dimension of each of side edges of each of the plurality of second sub-pixels in the width direction of each of the plurality of first pixels is smaller than the width of each of the plurality of first pixels, and a dimension of each of side edges of each of the plurality of second sub-pixels in the length direction of each of the plurality of first pixels is the same as the length of each of the plurality of first pixels.

According to an exemplary embodiment of the present disclosure, in the plurality of first pixels within the first region, in various rows of the plurality of first pixels, innermost first pixels each of which is located most adjacent to the regular display region in each row, are aligned in a first straight line at their respective inner side edges abutting against the regular display region with one another; and in various columns of the plurality of first pixels, innermost first pixels each of which is located most adjacent to the regular display region in each column, are aligned in a second straight line orthogonal to the first straight line at their respective inner side edges abutting against the regular display region with one another.

According to an exemplary embodiment of the present disclosure, in a condition that the first region is a continuous region in a stepped form: in the first sub-region, one side edge of a pair of side edges of each of the plurality of first sub-pixels which extends in the width direction of each of the plurality of first pixels, is in alignment with and in contact with a narrow side edge of a respective first pixel of the plurality of first pixels; and in the second sub-region, one side edge of a pair of side edges of each of the plurality of second sub-pixels which extends in the length direction of each of the plurality of first pixels, is in alignment with and in contact with a long side edge of a respective first pixel of the plurality of first pixels.

According to an exemplary embodiment of the present disclosure, in a condition that the first region is a continuous region in a rectangular form: in the first sub-region, each column of the plurality of first sub-pixels are arranged in alignment with a respective first pixel of the plurality of first pixels in the length direction of each of the plurality of first pixels; and for a single first sub-pixel in each column of the plurality of first sub-pixels which abuts against the respective first pixel of the plurality of first pixels, one side edge of the single first sub-pixel which extends in the width direction of each of the plurality of first pixels, is in alignment with and in contact with a narrow side edge of the respective first pixel of the plurality of first pixels; and in the second sub-region, each row of the plurality of second sub-pixels are arranged in alignment with a respective first pixel of the plurality of first pixels in the width direction of each of the plurality of first pixels; and for a single second sub-pixel in each row of the plurality of second sub-pixels which abuts against the respective first pixel of the plurality of first pixels, one side edge of the single second sub-pixel which extends in the length direction of each of the plurality of first pixels, is in alignment with and in contact with a long side edge of the respective first pixel of the plurality of first pixels.

According to an exemplary embodiment of the present disclosure, in the first sub-region, in each column of the plurality of first sub-pixel which comprises two or more first sub-pixels, dimensions of pairs of side edges of the first sub-pixels in the length direction of each of the plurality of first pixels are the same, or decrease sequentially in a direction facing away from the plurality of first pixels.

According to an exemplary embodiment of the present disclosure, in the second sub-region, in each row of the plurality of second sub-pixel which comprises two or more second sub-pixels, dimensions of pairs of side edges of the second sub-pixels in the width direction of each of the plurality of first pixels are the same, or decrease sequentially in a direction facing away from the plurality of first pixels.

According to an exemplary embodiment of the present disclosure, "a dimension of each of side edges of each of the plurality of first sub-pixels in a length direction of each of the plurality of first pixels is smaller than a length of each of the plurality of first pixels" comprises a condition in which the dimension of each of side edges of each of the plurality of first sub-pixels in a length direction of each of the plurality of first pixels is half of the length of each of the plurality of first pixels; and "a dimension of each of side edges of each of the plurality of second sub-pixels in the width direction of each of the plurality of first pixels is smaller than the width of each of the plurality of first pixels" comprises a condition in which the dimension of each of side edges of each of the plurality of second sub-pixels in the width direction of each of the plurality of first pixels is half of the width of each of the plurality of first pixels.

According to an exemplary embodiment of the present disclosure, the plurality of first sub-pixels comprise red first sub-pixels and green first sub-pixels, or comprise blue first sub-pixels and green first sub-pixels; and the plurality of second sub-pixels comprise red second sub-pixels and green second sub-pixels, or comprise blue second sub-pixels and green second sub-pixels.

According to an exemplary embodiment of the present disclosure, the regular display region is in the form of a remaining region which is formed by a rectangular region having its four corner regions being removed; and the irregular display region comprises a plurality of irregular-shape regions alternatively located at the corner regions.

According to an exemplary embodiment of the present disclosure, the irregular display region comprises a plurality of portions of the display region each of which is in the form of a partial round shape; and the first sub-region is a region contained within the second region at an angle of less than 45° with respect to the length direction of each of the plurality of first pixels, and the second sub-region is a region contained within the second region at an angle of more than 45° and less than 90° with respect to the length direction of each of the plurality of first pixels.

According to an exemplary embodiment of the present disclosure, the irregular display region comprises a plurality of portions of the display region each of which is in the form of ¼ round shape.

According to an exemplary embodiment of the present disclosure, the second region is a continuous irregular region, or a discontinuous irregular region.

According to an exemplary embodiment of the present disclosure, the first sub-region comprises a plurality of strip-shaped regions each of which extends in a direction parallel to a narrow side edge of each of the plurality of first pixels; and the second sub-region comprises a plurality of strip-shaped regions each of which extends in a direction parallel to a long side edge of each of the plurality of first pixels.

According to another aspect of the exemplary embodiment of the present disclosure, there is provided a display device 1, comprising the display panel as above.

BRIEF DESCRIPTION OF THE DRAWINGS

In order to illustrate the technical solutions of the embodiments of the present disclosure more clearly, a brief introduction will be given below to the drawings which are to be used in the description of the embodiments of the present disclosure. It is apparent that, the drawings as described below are merely some exemplary embodiments of the present disclosure, which can also be obtained by those skilled in the art, without paying any creative efforts. And other drawings may be obtained on the basis of following drawings.

DETAILED DESCRIPTION

Figure 1A:
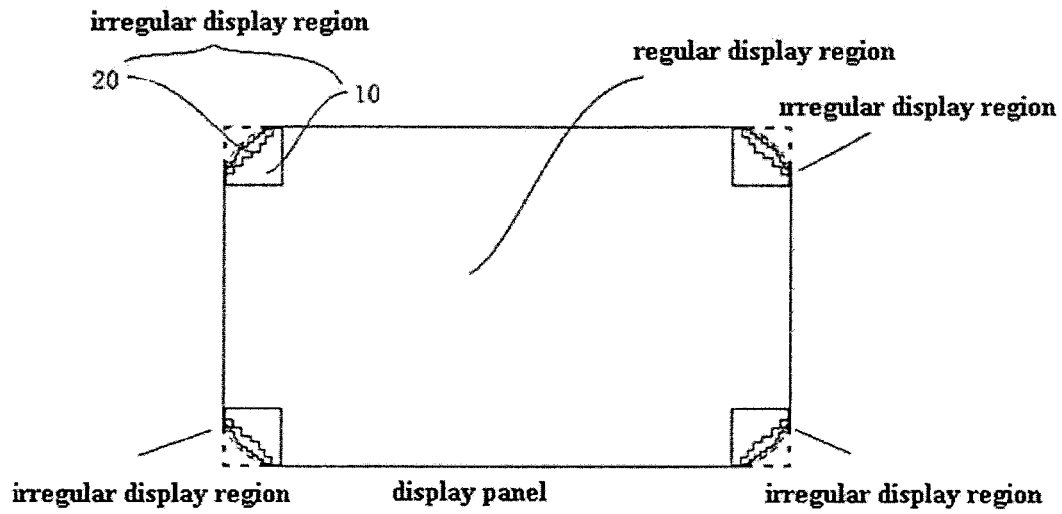
FIG. 1(a) illustrates a schematic view of a display panel according to an embodiment of the disclosure.

The technical solutions of the embodiments of the present disclosure will be described clearly and completely in view of the drawings in the embodiments of the present disclosure. It is apparent that, the embodiments as described are parts of the embodiments of the present disclosure, rather than all embodiments of the disclosure exclusively. Based on the embodiments of the present disclosure, all other embodiments acquired by a person of ordinary skill in the art without paying any creative efforts may fall within the scope of the protection of the present disclosure.

Respective dimension and shape of each component in the drawings are only intended to exemplarily illustrate the contents of the disclosure, rather than to demonstrate the practical dimension or proportion of components of a display panel and a display device according to an embodiment of the disclosure.

Then a display panel and a display device according to embodiments of the disclosure are introduced in detail hereinafter by listing several specific embodiments of the disclosure.

Figure 1B:
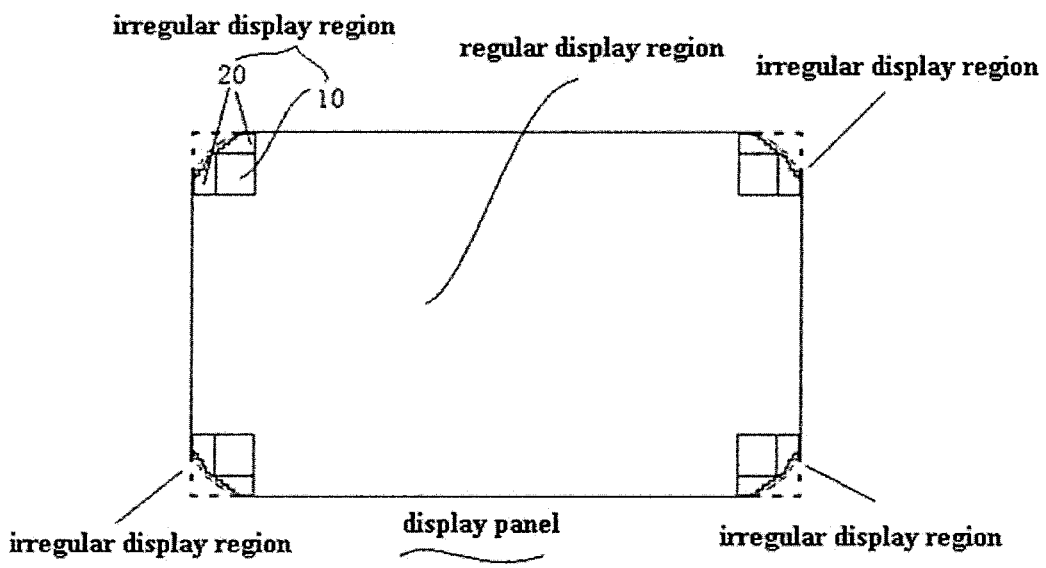
FIG. 1(b) illustrates a schematic view of a display panel according to another embodiment of the disclosure.

FIG. 1(a) illustrates a schematic view of a display panel according to an embodiment of the disclosure; FIG. 1(b) illustrates a schematic view of a display panel according to another embodiment of the disclosure; and FIG. 2 illustrates a schematic partial view of a display panel according to embodiments of the disclosure.

Figure 2:
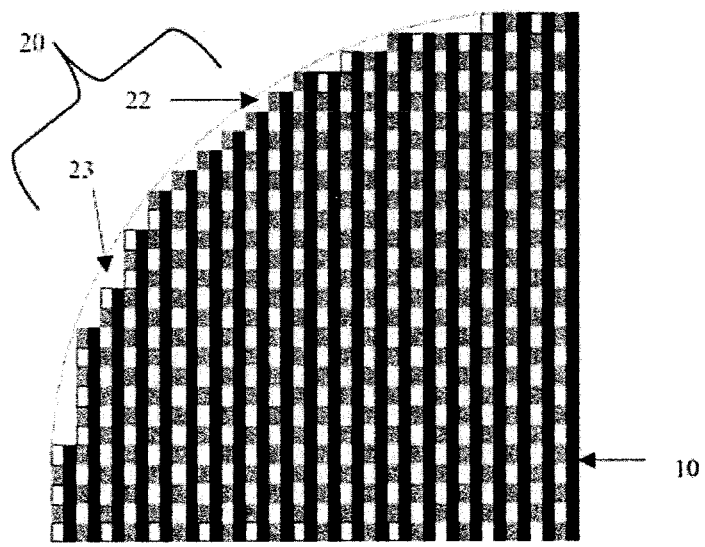
FIG. 2 illustrates a schematic partial view of a display panel according to embodiments of the disclosure.

Referring to FIG. 1(a), FIG. 1(b) and FIG. 2, a display panel according to embodiments of the disclosure is illustrated. And FIG. 1(a) and FIG. 1(b) illustrate exemplary overall structures of display panels according to different embodiments of the disclosure, and FIG. 2 illustrates a schematic partial view of a display panel according to embodiments of the disclosure, respectively. According to a general technical concept of embodiments of the disclosure, in an aspect of embodiments of the disclosure, a display panel is provided, the display panel having a display region defined therein, the display region comprising: a regular display region; and an irregular display region located at corners of the regular display region, the irregular display region comprising a first region 10 and a second region 20.

Figure 3:
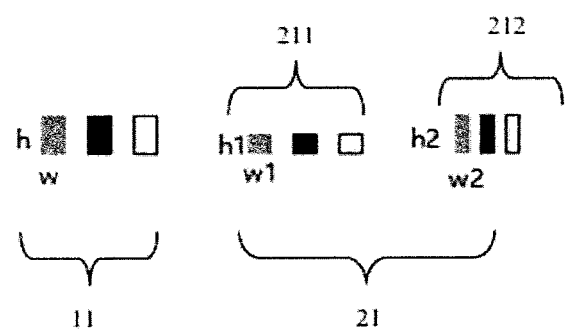
FIG. 3 illustrates a schematic structural view of pixels in a display panel according to embodiments of the disclosure.
Figure 4:
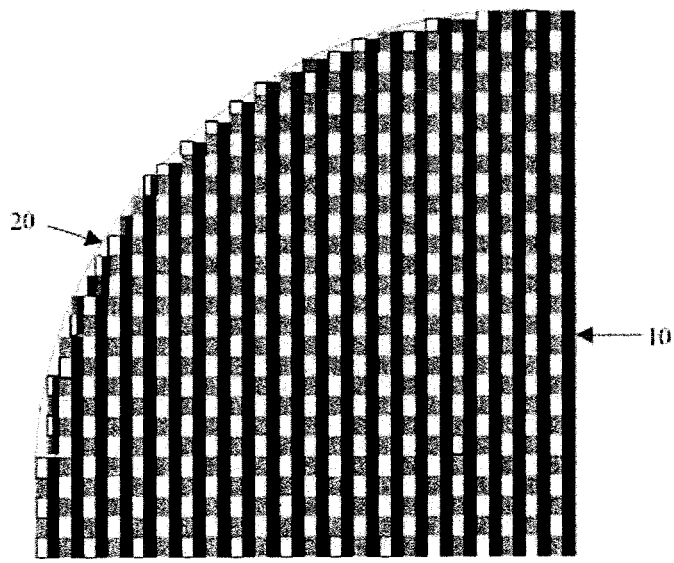
FIG. 4 illustrates a schematic partial view of a display panel according to embodiments of the disclosure.

The second region 20 is located at edges of the irregular display region (e.g., at edges of the irregular display region each of which is shown to be substantially in the form of a round corner) and outside the first region 10; and the first region 10 is provided with a plurality of first pixels 11 therein; and as illustrated in FIG. 3 and FIG. 4, the second region 20 is provided with a plurality of second pixels 21 therein; and each of the plurality of second pixels 21 has an area smaller than that of each of the plurality of first pixels 11.

In some embodiments, by way of example, as illustrated in FIG. 1(a) and FIG. 1(b), the regular display region is for example in the form of a remaining region which is formed by a rectangular region having its four corner regions being removed; and the irregular display region comprises a plurality of irregular-shape regions alternatively located at the corner regions, for example four round-corner regions, e.g., one of which may be exemplarily shown to be the irregular display region which is located at an upper left corner of the regular display region and in the form of substantially a round-corner shape.

Moreover, as illustrated in FIG. 1(a), for example, the first region 10 is a continuous region, and inner side edges of the first region adjacent to the regular display region may for example shown to be two right-angle side edges orthogonal to each other. More specifically, by way of example, as illustrated, the first region 10 is a continuous region in a stepped form; and more specifically, inner side edges of the first region adjacent to the regular display region are for example shown to be two right-angle side edges orthogonal to each other, and a plurality of outer side edges of the first region facing away from the regular display region are a plurality of side edges which are for example shown to be sequentially in a staggered arrangement and are formed into a series of stepped shapes (e.g., a series of right-angle stepped shapes as illustrated) sequentially connected with one another. Or alternatively, by way of example, as illustrated in FIG. 1(b), the first region 10 is a continuous region in a rectangular form; and more specifically, inner side edges of the first region adjacent to the regular display region are for example shown to be two right-angle side edges orthogonal to each other, and outer side edges of the first region facing away from the regular display region are for example shown to be two right-angle side edges orthogonal to each other.

Specifically, for example as illustrated in FIG. 1(a), FIG. 1(b) in view of FIG. 2, the first region 10 as illustrated is a first region 10 within one of the plurality of irregular-shape regions which is located at an upper left location of the regular display region; and in the plurality of first pixels 11 within the first region, in various rows of the plurality of first pixels, innermost first pixels 11 each of which is located most adjacent to the regular display region in each row, are aligned in a first straight line at their respective inner side edges abutting against the regular display region with one another (as illustrated, rightmost pixels in the first region 10 are aligned with one another, and respective right side edges of these rightmost pixels abutting against the regular display region are arranged in one and the same straight line); and in various columns of the plurality of first pixels, innermost first pixels 11 each of which is located most adjacent to the regular display region in each column, are aligned in a second straight line orthogonal to the first straight line at their respective inner side edges abutting against the regular display region with one another (for example as illustrated in FIG. 2, lowest pixels in the first region 10 are aligned with one another, and respective lower side edges of these lowest pixels abutting against the regular display region are arranged in one and the same straight line).

Accordingly, as illustrated in FIG. 2, for example, the second region 20 is a region outside the first region 10, within the irregular display region, in other words, a region which is located within the irregular display region and is separated from the regular display region by the first region 10. Moreover, specifically, as illustrated in FIG. 2, for example, the second region is a continuous irregular region, or a discontinuous irregular region. In fact, the second region 20 is a continuous irregular region or a discontinuous irregular region, which is located in a gap formed between the first region 10 and edges of the whole irregular display region.

In embodiments of the disclosure, as illustrated in FIG. 2, it shows a portion of regions of the display panel, for example, a portion of the irregular display region being located at an upper left corner of the regular display region, as illustrated in FIG. 1(a) or FIG. 1(b), and the plurality of first pixels 11 in the first region 10 are arranged in an array. And since each of the plurality of first pixels is excessively large, then a marginal irregular region of the irregular display region of the display panel may not be filled up sufficiently, and the second region 20 may in turn be formed outside the first region 10.

As illustrated in FIG. 4, in embodiments of the disclosure, the plurality of second pixels 21 are provided in the second region 20; and the plurality of second pixels 21 are used to fill the second region 20 so as to reduce a blank region (i.e., empty region) in the second region 20. Therefore, when the display screen displays, it may be possible to decrease the visual feeling of some saw-tooth forms existing at edge portions (e.g., the corner portions as mentioned above) of the display panel, more specifically at outer edges of the second region, within the irregular display region.

In embodiments of the disclosure, as illustrated in FIG. 2, the second region 20 further comprises a first sub-region 22 and a second sub-region 23; the plurality of first regions 11 are located in the first region 10 and the plurality of second pixels 21 are located in the second region 20; and the plurality of second pixels 21 being located in the second region 20 comprise a plurality of first sub-pixels 211 provided within the first sub-region 22 and a plurality of second sub-pixels 212 provided within the second sub-region 23.

As illustrated in FIG. 2, in embodiments of the disclosure, the first sub-region is a region comprising a plurality of strip-shaped region (e.g., horizontal strips as illustrated), each of which extends in a direction parallel to a narrow side edge of each of the plurality of first pixels 11; and the second sub-region is a region comprising a plurality of strip-shaped regions (e.g., vertical strips as illustrated), each of which extends in a direction parallel to a long side edge of each of the plurality of first pixels 11.

In embodiments of the disclosure, as illustrated in FIG. 3, a dimension of each of side edges of each of the plurality of first sub-pixels 211 in a width direction of each of the plurality of first pixels 11 is the same as a width of each of the plurality of first pixels 11, and a dimension of each of side edges of each of the plurality of first sub-pixels 211 in a length direction of each of the plurality of first pixels 11 is smaller than a length of each of the plurality of first pixels 11; and a dimension of each of side edges of each of the plurality of second sub-pixels 212 in the width direction of each of the plurality of first pixels 11 is smaller than the width of each of the plurality of first pixels 11, and a dimension of each of side edges of each of the plurality of second sub-pixels 212 in the length direction of each of the plurality of first pixels 11 is the same as the length of each of the plurality of first pixels 11.

In specific embodiments of the disclosure, provided that the first region 10 is a continuous region in a stepped form as illustrated in FIG. 1(a), then, in a condition that the dimension of each of side edges of each of the plurality of first sub-pixels 211 in the width direction of each of the plurality of first pixels 11 is the same as the width of each of the plurality of first pixels 11, the plurality of first sub-pixels 211 are placed in the first sub-region 22; for example, one side edge of a pair of side edges of each of the plurality of first sub-pixels 211 which extends in the width direction of each of the plurality of first pixels 11, is in alignment with and in contact with a narrow side edge of a respective first pixel of the plurality of first pixels 11. And a dimension of each side edge of another pair of side edges of each of the plurality of first sub-pixels 211 (i.e., a pair of side edges of each of the plurality of first sub-pixels 211 extending in the length direction of each of the plurality of first pixels 11) is smaller than the length of each of the plurality of first pixels 11. As such, by such a setting in which the plurality of first sub-pixels 211 are provided in the first sub-region comprising a plurality of strip-shaped regions (i.e., a plurality of horizontal strips), at least in the length direction of each of the plurality of first pixels 11 (i.e., a vertical direction as illustrated), the plurality of first sub-pixels 211 may fill a blank in the first sub-region 22 as much as possible, facilitating decreasing the visual feeling of saw-tooth appearing on the display panel. Similarly, in a condition that the dimension of each of side edges of each of the plurality of second sub-pixels 212 in the length direction of each of the plurality of first pixels 11 is the same as the length of each of the plurality of first pixels 11, the plurality of second sub-pixels 212 are placed in the second sub-region 23; for example, one side edge of a pair of side edges of each of the plurality of second sub-pixels 212 which extends in the length direction of each of the plurality of first pixels 11, is in alignment with and in contact with a long side edge of a respective first pixel of the plurality of first pixels 11. And a dimension of each side edge of another pair of side edges of each of the plurality of second sub-pixels 212 (i.e., a pair of side edges of each of the plurality of second sub-pixels 212 extending in the width direction of each of the plurality of first pixels 11) is smaller than the width of each of the plurality of first pixels 11. As such, by such a setting in which the plurality of second sub-pixels 212 are provided in the second sub-region comprising a plurality of strip-shaped regions (i.e., a plurality of vertical strips), at least in the width direction of each of the plurality of first pixels 11 (i.e., a horizontal direction as illustrated), the plurality of second sub-pixels 212 may fill a blank in the second sub-region 23 as much as possible, facilitating decreasing the visual feeling of saw-tooth appearing on the display panel. Moreover, since an area of each of the plurality of second pixels 21 is smaller than that of each of the plurality of first pixels 11, and generally speaking, a total area of the plurality of second pixels 21 is smaller than a total area of the plurality of first pixels 11, then a luminescent intensity of each of the plurality of second pixels 21 is smaller than a luminescent intensity of each of the plurality of first pixels 11, then, when the observer observes a portion of the irregular display region for example at the corner portion(s) of the display panel, the observer's line of sight may mainly focuses on the first sub-region 22 which has a relatively large area and is relatively bright in the irregular display region, facilitating further decreasing the visual feeling of saw-tooth appearing at marginal region on the display panel.

In embodiments of the disclosure, "a dimension of each of side edges of each of the plurality of first sub-pixels 211 in a length direction of each of the plurality of first pixels 11 is smaller than a length of each of the plurality of first pixels 11" may for example more specifically comprise a condition in which the dimension of each of side edges of each of the plurality of first sub-pixels 211 in the length direction of each of the plurality of first pixels 11 is half of the length of each of the plurality of first pixels 11; and "a dimension of each of side edges of each of the plurality of second sub-pixels 212 in the width direction of each of the plurality of first pixels 11 is smaller than the width of each of the plurality of first pixels 11" may for example more specifically comprise a condition in which the dimension of each of side edges of each of the plurality of second sub-pixels 212 in the width direction of each of the plurality of first pixels 11 is half of the width of each of the plurality of first pixels 11.

And alternatively, in other specific embodiments of the disclosure, provided that the first region 10 is a continuous region in a rectangular form (for example, in said first region of a rectangular form, it is divided into the first sub-region 22 and the second sub-region 23 by an outer vertex on an end of its diagonal line) as illustrated in FIG. 1(b), then, each column of first sub-pixels 211 in the first sub-region 22 for example comprises at least one first sub-pixels 211, and furthermore, the number of the first sub-pixels 211 contained in each column of first sub-pixels 211 may for example increase progressively in a direction facing away from said outer vertex on an end of the diagonal line of the rectangular form; and each row of second sub-pixels 212 in the second sub-region 23 for example comprises at least one second sub-pixels 212, and furthermore, the number of the second sub-pixels 212 contained in each row of second sub-pixels 212 may for example increase progressively in a direction facing away from said outer vertex on the end of the diagonal line of the rectangular form.

In this case, in a condition that the dimension of each of side edges of each of the plurality of first sub-pixels 211 in the width direction of each of the plurality of first pixels 11 is the same as the width of each of the plurality of first pixels 11, the plurality of first sub-pixels 211 are placed in the first sub-region 22; for example, in the first sub-region 22, each column of the plurality of first sub-pixels 211 are arranged respectively in alignment with a respective first pixel of the plurality of first pixels 11 (in the length direction of each of the plurality of first pixels 11); and for a single first sub-pixel 211 in each column of the plurality of first sub-pixels 211 which abuts against the respective first pixel of the plurality of first pixels 11, one side edge of the single first sub-pixel which extends in the width direction of each of the plurality of first pixels 11, is in alignment with and in contact with a narrow side edge of the respective first pixel of the plurality of first pixels 11. And a dimension of each of side edges of each of the plurality of first sub-pixels 211 in the length direction of each of the plurality of first pixels 11 is smaller than the length of each of the plurality of first pixels 11. And in the first sub-region 22, in each column of the plurality of first sub-pixel 211 which comprises two or more first sub-pixels 211, dimensions of pairs of side edges of the first sub-pixels 211 in the length direction of each of the plurality of first pixels 11 are for example the same as one another, or for example decrease sequentially in a direction facing away from the plurality of first pixels 11, facilitating filling the first sub-region 22 with more first sub-pixels 211 in each column of first sub-pixels. As such, by such a setting in which the plurality of first sub-pixels 211 are provided in the first sub-region 22 comprising a plurality of strip-shaped regions (i.e., a plurality of horizontal strips), at least in the length direction of each of the plurality of first pixels 11 (i.e., a vertical direction as illustrated), the plurality of first sub-pixels 211 may fill a blank in the first sub-region 22 as much as possible, facilitating decreasing the visual feeling of saw-tooth appearing on the display panel.

Similarly, in this case, in a condition that the dimension of each of side edges of each of the plurality of second sub-pixels 212 in the length direction of each of the plurality of first pixels 11 is the same as the length of each of the plurality of first pixels 11, the plurality of second sub-pixels 212 are placed in the second sub-region 23; for example, in the second sub-region 23, each row of the plurality of second sub-pixels 212 are arranged respectively in alignment with a respective first pixel of the plurality of first pixels 11 (in the width direction of each of the plurality of first pixels 11); and for a single second sub-pixel 212 in each row of the plurality of second sub-pixels 212 which abuts against the respective first pixel of the plurality of first pixels 11, one side edge of the single second sub-pixel 212 which extends in the length direction of each of the plurality of first pixels 11, is in alignment with and in contact with a long side edge of the respective first pixel of the plurality of first pixels 11. And a dimension of each of side edges of each of the plurality of second sub-pixels 212 in the width direction of each of the plurality of first pixels 11 is smaller than the width of each of the plurality of first pixels 11. And in the second sub-region 23, in each row of the plurality of second sub-pixel 212 which comprises two or more second sub-pixels 212, dimensions of pairs of side edges of the second sub-pixels 212 in the width direction of each of the plurality of first pixels 11 are for example the same as one another, or for example decrease sequentially in a direction facing away from the plurality of first pixels 11, facilitating filling the second sub-region 23 with more second sub-pixels 212 in each row of second sub-pixels. As such, by such a setting in which the plurality of second sub-pixels 212 are provided in the second sub-region 23 comprising a plurality of strip-shaped regions (i.e., a plurality of vertical strips), at least in the width direction of each of the plurality of first pixels 11 (i.e., a horizontal direction as illustrated), the plurality of second sub-pixels 212 may fill a blank in the second sub-region 23 as much as possible, facilitating decreasing the visual feeling of saw-tooth appearing on the display panel.

In embodiments of the disclosure, the plurality of first sub-pixels 211 comprise red first sub-pixels and green first sub-pixels, or comprise blue first sub-pixels and green first sub-pixels; and the plurality of second sub-pixels 212 comprise red second sub-pixels and green second sub-pixels, or comprise blue second sub-pixels and green second sub-pixels.

In embodiments of the disclosure, as illustrated, gray color indicates red pixels, black color indicates green pixels, and white color indicates blue pixels. As illustrated in FIG. 2, provided that the plurality of first pixels 11 in the first region 10 are arranged depending on a rule of composition among red (R), green (G), and blue (B), then, when the plurality of first sub-pixels 211 and the plurality of second sub-pixels 212 are being arranged, it is required that they cooperate with the plurality of first pixels 11 to form collectively an arrangement rule among R, G, and B. By way of example, in a condition that a portion of the plurality of first pixels 11 at edges of round corners are red pixels, then, at blank locations immediately adjacent to said red pixels, blue sub-pixels and green sub-pixels are provided, i.e., depending on specific arrangement rule of the plurality of first pixels 11, the plurality of first sub-pixels 211 and the plurality of second sub-pixels 212 are provided. In order to implement a display of compositing three primary-colors (i.e., red, green and blue) in the display panel, when the plurality of first sub-pixels and the plurality of second sub-pixels, the plurality of first sub-pixels and the plurality of second sub-pixels are distributed within the first sub-region and the second sub-region respectively, in such a combination that the two types of sub-pixels present as red sub-pixels and green sub-pixels, respectively, or present as blue sub-pixels and green sub-pixels, respectively.

Figure 5:
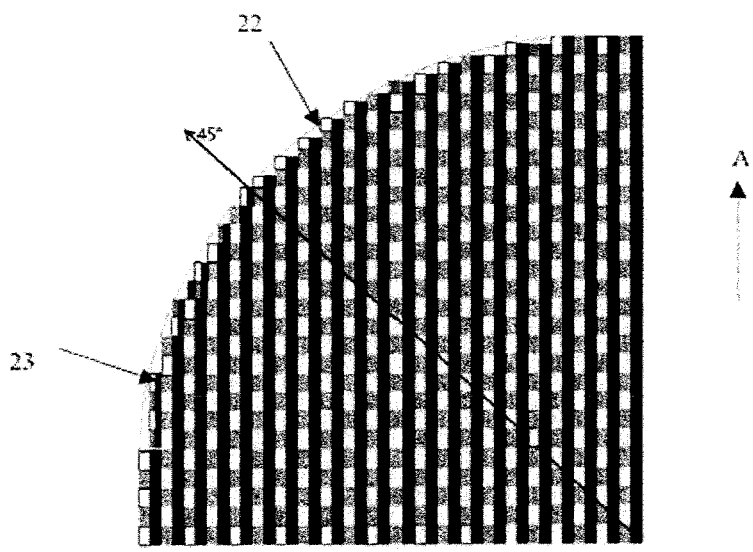
FIG. 5 illustrates a schematic partial view of a display panel according to embodiments of the disclosure.

In embodiments of the disclosure, referring to FIG. 1(*a*), FIG. 1(*b*) in view of FIG. 5, the irregular display region comprises a plurality of portions of the display region each of which is in the form of a partial round shape, for example, substantially in the form of ¼ round shape of the display region; and the first sub-region 22 is a region contained within the second region 20 at an angle of less than 45° with respect to the length direction 'A' of each of the plurality of first pixels 11, and the second sub-region 23 is a region contained within the second region 20 at an angle of more than 45° and less than 90° with respect to the length direction of each of the plurality of first pixels 11.

According to a general technical concept of embodiments of the disclosure, in another aspect of embodiments of the disclosure, a display device is provided, the display device comprising the display panel as in any one of above embodiments; and the display device may further comprise a frame body shaped to accommodating the display panel therein. The display device may be any product or component having a display function such as a display panel, an electronic paper, a mobile phone, a tablet computer, a television, a display, a laptop computer, a digital photo frame, a navigator and the like. In the display device, at edges of the irregular display region, for example at the corner portions of the display panel, by providing sub-pixels each of which has an area smaller than that of each pixel in the regular display region, then a pixel fill rate in an blank region of the irregular display region is enhanced, so as to decrease the visual feeling of saw-tooth appearing at edges of the display panel (specially at the corner portions of the display panel).

As compared with relevant art, on the basis of above technical solutions, the display panel and the display device according to embodiments of the disclosure at least have beneficial effects as below:

In conclusion, as to the display panel according to embodiments of the disclosure, the display panel having a display region defined therein, the display region comprising: a regular display region; and an irregular display region located at corners of the regular display region, the irregular display region comprising a first region and a second region which is located at edges of the irregular display region and outside the first region; the first region is provided with a plurality of first pixels therein, and the second region is provided with a plurality of second pixels therein, each of the plurality of second pixels having an area smaller than that of each of the plurality of first pixels. In embodiments of the disclosure, at edges of the irregular display region, for example at the corner portions of the display panel, by providing sub-pixels each of which has an area smaller than that of each pixel in the regular display region, then a pixel fill rate in an blank region of the irregular display region is enhanced, so as to decrease the visual feeling of saw-tooth appearing at edges of the display panel.

Those skilled in the art can clearly understand that, for the sake of convenience, simplicity and brief of description, the specific working processes of the systems, devices and units described above may refer to the corresponding processes in the embodiments of the methods as described above, and will not be repeated herein any more.

The above contents are merely exemplary embodiments of the present disclosure and are not intended to restrict the disclosure. Any modification, equivalent substitution and improvement as made within the spirit and principles of the disclosure will be included in the scope of protection of the present disclosure.

As mentioned above, the scope of protection of the present disclosure may not be limited to the specific embodiments of the present disclosure. It may easily occur to any one of those skilled in the art that modifications, variations or substitutions of embodiments of the disclosure as disclosed in the present disclosure will be covered by the scope of protection of the present disclosure. Therefore, the scope of protection of the present disclosure will be defined by the scope of protection of the accompanying claims.

What is claimed is:

1. A display panel, the display panel having a display region defined therein, the display region comprising: a regular display region; and an irregular display region located at corners of the regular display region, the irregular display region comprising a first region and a second region which is located at edges of the irregular display region and outside the first region,
    wherein the first region is provided with a plurality of first pixels therein, and the second region is provided with a plurality of second pixels therein, each of the plurality of second pixels having an area smaller than that of each of the plurality of first pixels,
    wherein the second region comprises a first sub-region and a second sub-region and the plurality of second pixels comprises a plurality of first sub-pixels provided within the first sub-region and a plurality of second sub-pixels provided within the second sub-region;
    the first region is a continuous region in a rectangular form, outer side edges of the first region facing away from the regular display region are two right-angle side edges orthogonal to each other, and inner side edges of the second region facing towards the regular display region are two right-angle side edges orthogonal to each other, the outer side edge of the first region abutting against the inner side edge of the second region respectively; and
    wherein a dimension of each of side edges of each of the plurality of first sub-pixels in a width direction of each of the plurality of first pixels is the same as a width of each of the plurality of first pixels, and a dimension of each of side edges of each of the plurality of first sub-pixels in a length direction of each of the plurality of first pixels is smaller than a length of each of the plurality of first pixels; and
    a dimension of each of side edges of each of the plurality of second sub-pixels in the width direction of each of the plurality of first pixels is smaller than the width of each of the plurality of first pixels, and a dimension of each of side edges of each of the plurality of second sub-pixels in the length direction of each of the plurality of first pixels is the same as the length of each of the plurality of first pixels,
    wherein in the first sub-region, in each column of the plurality of first sub-pixel which comprises two or more first sub-pixels, dimensions of pairs of side edges of the first sub-pixels in the length direction of each of the plurality of first pixels decrease sequentially in a direction facing away from the plurality of first pixels; and
    wherein in the second sub-region, in each row of the plurality of second sub-pixel which comprises two or more second sub-pixels, dimensions of pairs of side edges of the second sub-pixels in the width direction of each of the plurality of first pixels decrease sequentially in a direction facing away from the plurality of first pixels, and
    wherein in a condition that the first region is a continuous region in a rectangular form;
    in the first sub-region, each column of the plurality of first sub-pixels are arranged in alignment with a respective first pixel of the plurality of first pixels in the length direction of each of the plurality of first pixels; and for a single first sub-pixel in each column of the plurality of first sub-pixels which abuts against the respective first pixel of the plurality of first pixels, one side edge of the single first sub-pixel which extends in the width direction of each of the plurality of first pixels, is in alignment with and in contact with a narrow side edge of the respective first pixel of the plurality of first pixels; and
    in the second sub-region, each row of the plurality of second sub-pixels are arranged in alignment with a respective first pixel of the plurality of first pixels in the width direction of each of the plurality of first pixels; and for a single second sub-pixel in each row of the plurality of second sub-pixels which abuts against the respective first pixel of the plurality of first pixels, one side edge of the single second sub-pixel which extends in the length direction of each of the plurality of first pixels, is in alignment with and in contact with a long side edge of the respective first pixel of the plurality of first pixels.

2. The display panel according to claim 1, wherein in the plurality of first pixels within the first region, in various rows of the plurality of first pixels, innermost first pixels each of which is located most adjacent to the regular display region in each row, are aligned in a first straight line at their respective inner side edges abutting against the regular display region with one another; and in various columns of the plurality of first pixels, innermost first pixels each of which is located most adjacent to the regular display region in each column, are aligned in a second straight line orthogonal to the first straight line at their respective inner side edges abutting against the regular display region with one another.

3. The display panel according to claim 1, wherein in a condition that the first region is a continuous region in a stepped form:

in the first sub-region, one side edge of a pair of side edges of each of the plurality of first sub-pixels which extends in the width direction of each of the plurality of first pixels, is in alignment with and in contact with a narrow side edge of a respective first pixel of the plurality of first pixels; and in the second sub-region, one side edge of a pair of side edges of each of the plurality of second sub-pixels which extends in the length direction of each of the plurality of first pixels, is in alignment with and in contact with a long side edge of a respective first pixel of the plurality of first pixels.

4. The display panel according to claim 1, wherein "a dimension of each of side edges of each of the plurality of first sub-pixels in a length direction of each of the plurality of first pixels is smaller than a length of each of the plurality of first pixels" comprises a condition in which the dimension of each of side edges of each of the plurality of first sub-pixels in a length direction of each of the plurality of first pixels is half of the length of each of the plurality of first pixels; and "a dimension of each of side edges of each of the plurality of second sub-pixels in the width direction of each of the plurality of first pixels is smaller than the width of each of the plurality of first pixels" comprises a condition in which the dimension of each of side edges of each of the plurality of second sub-pixels in the width direction of each of the plurality of first pixels is half of the width of each of the plurality of first pixels.

5. The display panel according to claim 1, wherein the plurality of first sub-pixels comprise red first sub-pixels and green first sub-pixels, or comprise blue first sub-pixels and green first sub-pixels; and the plurality of second sub-pixels comprise red second sub-pixels and green second sub-pixels, or comprise blue second sub-pixels and green second sub-pixels.

6. The display panel according to claim 1, wherein the regular display region is in the form of a remaining region which is formed by a rectangular region having its four corner regions being removed; and the irregular display region comprises a plurality of irregular-shape regions alternatively located at the corner regions.

7. The display panel according to claim 6, wherein the irregular display region comprises a plurality of portions of the display region each of which is in the form of a partial round shape; and the first sub-region is a region contained within the second region at an angle of less than 45° with respect to the length direction of each of the plurality of first pixels, and the second sub-region is a region contained within the second region at an angle of more than 45° and less than 90° with respect to the length direction of each of the plurality of first pixels.

8. The display panel according to claim 7, wherein the irregular display region comprises a plurality of portions of the display region each of which is in the form of ¼ round shape.

9. The display panel according to claim 1, wherein the second region is a continuous irregular region, or a discontinuous irregular region.

10. The display panel according to claim 1, wherein the first sub-region comprises a plurality of strip-shaped regions each of which extends in a direction parallel to a narrow side edge of each of the plurality of first pixels; and the second sub-region comprises a plurality of strip-shaped regions each of which extends in a direction parallel to a long side edge of each of the plurality of first pixels.

11. A display device, comprising the display panel according to claim 1.

* * * * *